(12) United States Patent
Lee et al.

(10) Patent No.: US 11,037,896 B2
(45) Date of Patent: Jun. 15, 2021

(54) METHOD AND APPARATUS FOR FORMING BACKSIDE DIE PLANAR DEVICES AND SAW FILTER

(71) Applicant: Intel Corporation, Santa Clara, CA (US)

(72) Inventors: Kevin J. Lee, Beaverton, OR (US); Ruchir Saraswat, Swindon (GB); Uwe Zillmann, Braunschweig (DE); Nicholas P. Cowley, Wroughton (GB); Richard J. Goldman, Cirencester (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/216,881

(22) Filed: Dec. 11, 2018

(65) Prior Publication Data

US 2019/0109107 A1   Apr. 11, 2019

Related U.S. Application Data

(63) Continuation of application No. 15/323,521, filed as application No. PCT/US2014/050134 on Aug. 7, 2014, now Pat. No. 10,290,598.

(51) Int. Cl.
*H01L 23/00* (2006.01)
*H01L 23/48* (2006.01)
(Continued)

(52) U.S. Cl.
CPC ............ *H01L 24/09* (2013.01); *G06F 1/16* (2013.01); *H01F 27/2804* (2013.01); *H01L 23/481* (2013.01); *H01L 23/5226* (2013.01); *H01L 23/5227* (2013.01); *H01L 23/645* (2013.01); *H01L 23/66* (2013.01); *H01L 24/17* (2013.01);
(Continued)

(58) Field of Classification Search
CPC ... H01L 24/09; H01L 23/481; H01L 23/5227; H01L 23/66; H01L 27/2804; H01L 23/5226; H01L 23/645; H01L 24/17; H01L 23/525; H01L 24/05; H01L 24/06;
(Continued)

(56) References Cited

U.S. PATENT DOCUMENTS

| 563,316 A | 7/1896 | Scribner |
| 5,633,616 A * | 5/1997 | Goto ................ H03H 3/08 310/313 A |

(Continued)

FOREIGN PATENT DOCUMENTS

| CN | 101336477 | 12/2008 | |
| JP | 08-162881 | * 6/1996 | ............... H03H 3/08 |

(Continued)

OTHER PUBLICATIONS

Extended European Search Report from European Patent Application No. 14899177.1 dated Mar. 6, 2018, 7 pgs.

(Continued)

*Primary Examiner* — Alexander O Williams
(74) *Attorney, Agent, or Firm* — Green, Howard & Mughal LLP

(57) ABSTRACT

Described is an apparatus which comprises: a backside of a first die having a redistribution layer (RDL); and one or more passive planar devices disposed on the backside, the one or more passive planar devices formed in the RDL.

18 Claims, 10 Drawing Sheets

(51) Int. Cl.
  *H01L 23/522* (2006.01)
  *H01L 23/66* (2006.01)
  *G06F 1/16* (2006.01)
  *H01F 27/28* (2006.01)
  *H01L 23/64* (2006.01)
  *H03H 7/42* (2006.01)
  *H03H 9/64* (2006.01)
  *H01L 23/525* (2006.01)

(52) U.S. Cl.
  CPC ............... *H03H 7/42* (2013.01); *H03H 9/64* (2013.01); *H01L 23/525* (2013.01); *H01L 24/05* (2013.01); *H01L 24/06* (2013.01); *H01L 24/13* (2013.01); *H01L 24/16* (2013.01); *H01L 2223/6616* (2013.01); *H01L 2223/6661* (2013.01); *H01L 2223/6677* (2013.01); *H01L 2224/0233* (2013.01); *H01L 2224/02372* (2013.01); *H01L 2224/02375* (2013.01); *H01L 2224/02379* (2013.01); *H01L 2224/0401* (2013.01); *H01L 2224/05548* (2013.01); *H01L 2224/16146* (2013.01); *H01L 2224/16225* (2013.01); *H01L 2224/17181* (2013.01)

(58) Field of Classification Search
  CPC ........... H01L 24/13; H01L 24/16; G06F 1/16; H03H 7/42; H03H 9/64; H01F 27/28; H01F 27/804
  USPC ........................................ 257/678, 686, 723
  See application file for complete search history.

(56) References Cited

U.S. PATENT DOCUMENTS

| | | | |
|---|---|---|---|
| 6,020,266 A | 2/2000 | Hussein et al. | |
| 6,930,334 B2* | 8/2005 | Suzuki | H01L 23/5223 257/275 |
| 6,943,440 B2 | 9/2005 | Kim et al. | |
| 6,984,302 B2 | 1/2006 | Lee | |
| 7,088,005 B2 | 8/2006 | Lee | |
| 7,391,112 B2 | 6/2008 | Li et al. | |
| 7,442,634 B2 | 10/2008 | Dubin et al. | |
| 7,498,252 B2 | 3/2009 | Lee et al. | |
| 7,585,615 B2 | 9/2009 | Schultz et al. | |
| 7,732,936 B2 | 6/2010 | Goodner | |
| 7,833,899 B2 | 11/2010 | Lee | |
| 7,964,965 B2 | 6/2011 | Lee | |
| 7,982,311 B2 | 7/2011 | Lee | |
| 8,653,626 B2* | 2/2014 | Lo | H01L 21/56 257/532 |
| 8,704,336 B2 | 4/2014 | He et al. | |
| 8,933,564 B2 | 1/2015 | Pelto et al. | |
| 8,994,174 B2 | 3/2015 | Lee | |
| 9,142,510 B2 | 9/2015 | Lee et al. | |
| 9,224,647 B2 | 12/2015 | Koo et al. | |
| 9,449,913 B2 | 9/2016 | Lee et al. | |
| 9,478,474 B2* | 10/2016 | Chen | H01L 25/0652 |
| 10,290,598 B2* | 5/2019 | Lee | H01L 23/5227 |
| 2003/0111931 A1 | 6/2003 | Suzuki et al. | |
| 2003/0122153 A1 | 7/2003 | Suzuki et al. | |
| 2005/0110131 A1 | 5/2005 | Lee | |
| 2006/0022861 A1* | 2/2006 | Kudoh | H03M 3/368 341/155 |
| 2006/0095896 A1 | 5/2006 | Li et al. | |
| 2006/0132262 A1* | 6/2006 | Fazzio | H03H 9/02118 333/187 |
| 2008/0003715 A1 | 1/2008 | Lee et al. | |
| 2008/0079166 A1 | 4/2008 | Lee et al. | |
| 2008/0122078 A1 | 5/2008 | He et al. | |
| 2008/0128888 A1 | 6/2008 | Park et al. | |
| 2009/0133908 A1 | 5/2009 | Goodner et al. | |
| 2009/0166324 A1 | 7/2009 | Lee | |
| 2012/0068342 A1 | 3/2012 | Lee | |
| 2012/0074585 A1 | 3/2012 | Koo et al. | |
| 2012/0175731 A1 | 7/2012 | Chen et al. | |
| 2012/0280366 A1 | 11/2012 | Kamgaing et al. | |
| 2013/0200528 A1* | 8/2013 | Lin | H01L 21/561 257/774 |
| 2014/0027880 A1* | 1/2014 | Duevel | H01F 17/0006 257/531 |
| 2014/0110841 A1* | 4/2014 | Beer | H01L 23/49822 257/738 |
| 2014/0185264 A1* | 7/2014 | Chen | H01L 25/0652 361/814 |
| 2014/0266469 A1* | 9/2014 | Issakov | H03F 3/16 330/301 |
| 2014/0293529 A1* | 10/2014 | Nair | H01Q 1/2291 361/679.31 |
| 2015/0042438 A1* | 2/2015 | Liu | H01F 27/2804 336/200 |
| 2015/0084194 A1* | 3/2015 | Molzer | H01L 23/481 257/741 |
| 2016/0049371 A1 | 2/2016 | Lee et al. | |
| 2016/0181196 A1 | 6/2016 | Lee et al. | |
| 2016/0372449 A1* | 12/2016 | Rusu | H01L 25/0657 |
| 2017/0011987 A1 | 1/2017 | Lee | |
| 2017/0040266 A1 | 2/2017 | Lin et al. | |
| 2017/0062357 A1 | 3/2017 | Kamgaing et al. | |
| 2017/0103969 A1* | 4/2017 | Krause | H01L 23/48 |
| 2017/0141058 A1* | 5/2017 | Lee | G06F 1/16 |
| 2017/0373048 A1 | 12/2017 | Yu et al. | |

FOREIGN PATENT DOCUMENTS

| | | | | |
|---|---|---|---|---|
| JP | H08162881 | | 6/1996 | |
| JP | 2003-163310 A | * | 6/2003 | ............. H01L 24/32 |
| JP | 2003-188675 | * | 7/2003 | ......... H03H 9/02984 |
| JP | 2009524917 | | 7/2009 | |
| WO | 2007/101364 | * | 9/2007 | ............. H01L 25/16 |
| WO | 2015099668 | | 7/2015 | |
| WO | 2016043738 | | 3/2016 | |

OTHER PUBLICATIONS

Final Office Action from U.S. Appl. No. 15/323,521 dated Jul. 5, 2018, 14 pgs.
International Search Report and Written Opinion from PCT/US2014/050134 dated Feb. 16, 2017, 13 pgs.
International Search Report & Written Opinion, dated May 14, 2015, for PCT Patent Application No. PCT/US2014/050134.
Non-Final Office Action from Japanese Patent Application No. 2017-505626 dated Oct. 15, 2018, 7 pgs.
Non-Final Office Action from U.S. Appl. No. 15/323,521 dated Dec. 15, 2017, 14 pgs.
Notice of Allowance from U.S. Appl. No. 15/323,521 dated Oct. 3, 2018, 5 pgs.
Ingerly, D et al., "Low-K Interconnect Stack with Thick Metal 9 Redistribution Layer and Cu Die Bump for 45nm High Volume Manufacturing", Interconnect Technology Conference, 2008. IITC 2008. pp. 216-218, 2008.
Mistry, C et al., "A 45nm Logic Technology with High-k+Metal Gate Transistors, Strained Silicon, 9 Cu Interconnect Layers, 193nm Dry Patterning, and 100% Pb-free Packaging", Electron Devices Meeting, 2007. IEDM 2007, pp. 247-250, 2007.
Moon, P, "Process and Electrical Results for the On-die Interconnect Stack for Intel's 45nm Process Generation", Intel Technology Journal, vol. 12, No. 2, 2008.
Non-Final Office Action from Taiwan Patent Application No. 104121341 dated May 22, 2019, 25 pgs.
Office Action from Japanese Patent Application No. 2017-505626 dated Jun. 6, 2019, 11 pgs.
Notice of Allowance from Taiwan Patent Application No. 104121341 dated Oct. 2, 2019, 3 pgs.
Office Action from Chinese Patent Application No. 201480080467.X dated Dec. 31, 2019, 25 pgs.
Office Action from Malaysian Patent Application No. PI2017700181 dated Jul. 13, 2020, 3 pgs.

(56) References Cited

OTHER PUBLICATIONS

Office Action from Chinese Patent Application No. 201480080467.X dated Sep. 7, 2020, 8 pgs.
Notice of Allowance from Malaysian Patent Application No. PI 2017700181 dated Mar. 17, 2021, 1 pg.
Office Action from Korean Patent Application No. 10-2017-7001161 dated Jan. 11, 2021, 16 pgs.

\* cited by examiner

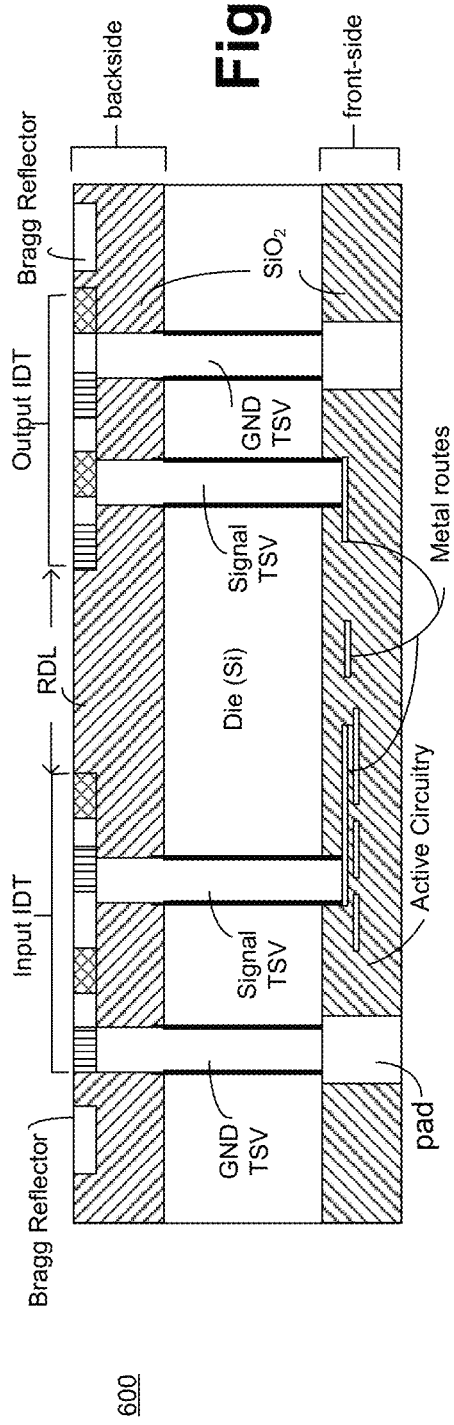
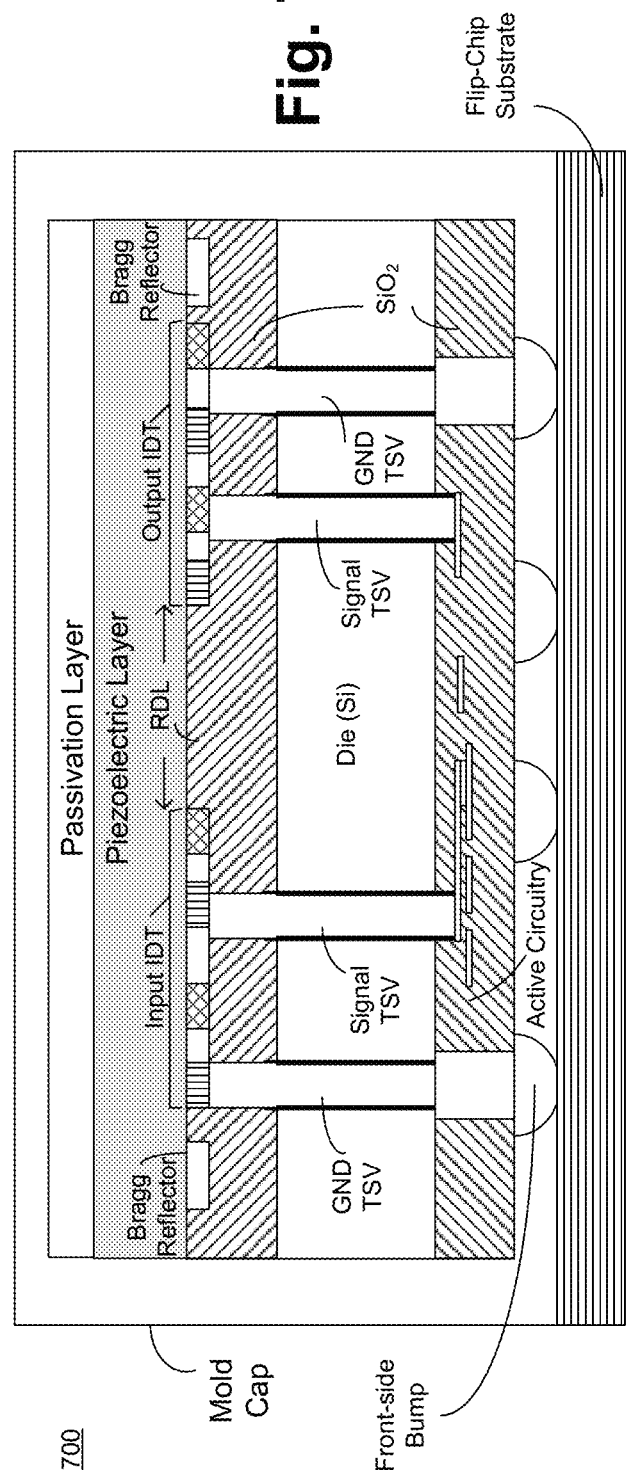

METHOD AND APPARATUS FOR FORMING BACKSIDE DIE PLANAR DEVICES AND SAW FILTER

CLAIM FOR PRIORITY

This application is a continuation of prior U.S. patent application Ser. No. 15/323,521, now U.S. Pat. No. 10,290,598, filed on Jan. 3, 2017 and titled "METHOD AND APPARATUS FOR FORMING BACKSIDE DIE PLANAR DEVICES AND SAW FILTER," which is a National Stage Entry of, and claims priority to, PCT Application No. PCT/US2014/050134, filed on Aug. 7, 2014 and titled "METHOD AND APPARATUS FOR FORMING BACKSIDE DIE PLANAR DEVICES AND SAW FILTER," which is incorporated by reference in entirety.

BACKGROUND

The current method for integrating planar passive devices such as distributive filter elements, inductors, baluns, etc., onto monolithic integrated circuits (ICs) is to fabricate them onto the front-side or active side of the die. Front-side of the die is the side of the substrate having active devices. FIG. 1A illustrates a top view 100 of a monolithic RF (Radio Frequency) IC with planar devices (e.g., Stripline Inter-digital Filter, Inductors, Coupled open circuit lines, and Stub-type Low Pass Filters (LPF)), and with active devices (e.g., Phase Locked Loop (PLL) and input-output transceivers (I/Os)) on the active side of the IC die. The planar devices take up a significant portion of the active region of the die. Making smaller dies is thus challenging.

The industry is also moving towards higher integrated systems. For example, mobile communication devices are manufactured under high demands of cost reduction as well as drive for miniaturization, and therefore the integration of more and more components onto a single System-on-Chip (SoC) is an important focus area. Surface Acoustic Wave (SAW) filters play an important role in modern mobile communication devices and are widely used as Band Pass Filters (BPF) and antenna duplexers. SAW filters may also contain electromechanical components and are fabricated by special micromachining technologies by means of separate devices beneath the IC containing the transmitter and receiver circuits. In multiband communication devices, for example, in Long-Term Evolution (LTE) transceivers, a substantial amount of SAW filters is required which are mostly separate components occupying substantial board area.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 6 illustrates a cross-section of a die having RDL fingers on the backside of the die for Inter-digital Transducers (IDT) and for reflector shorted metal strip arrays, according to some embodiments of the disclosure.

FIG. 7 illustrates a cross-section of a die with reference to FIG. 6 with piezoelectric layer and bonded into a flip-chip package, according to some embodiments of the disclosure.

DETAILED DESCRIPTION

Generally, the backside of the die (i.e., backside of the substrate of the die) includes arrays of vias (e.g., Through-Silicon-Via (TSV)) concentrated near the middle of the backside while the rest of the backside is largely empty space. These vias are used to fan-out the arrays of vias to standard landing pad configuration for backside chip-to-chip connections. For example, approximately 16 µm pitch arrays of vias fan-out to 40×50 µm pitch Joint Electron Device Engineering Council (JEDEC) standard landing pad configuration. Various embodiments are described with reference to TSVs. However, other types of vias may also be used.

Figure 1A:
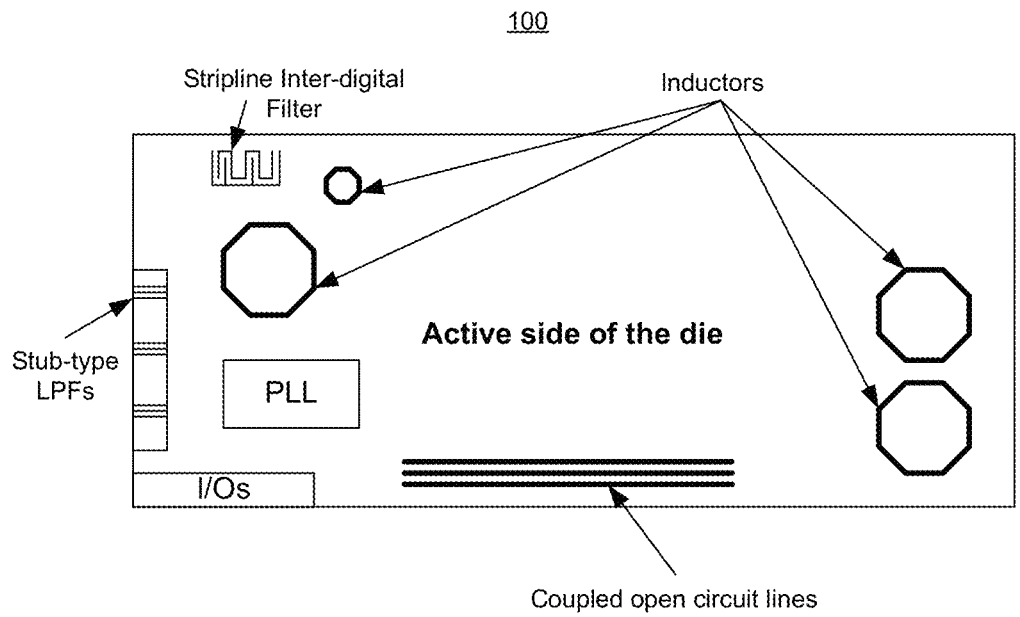
FIG. 1A illustrates a top view of a monolithic Radio Frequency (RF) Integrated Circuit (IC) with planar passive devices disposed on the active side of the IC die.
Figure 1B:
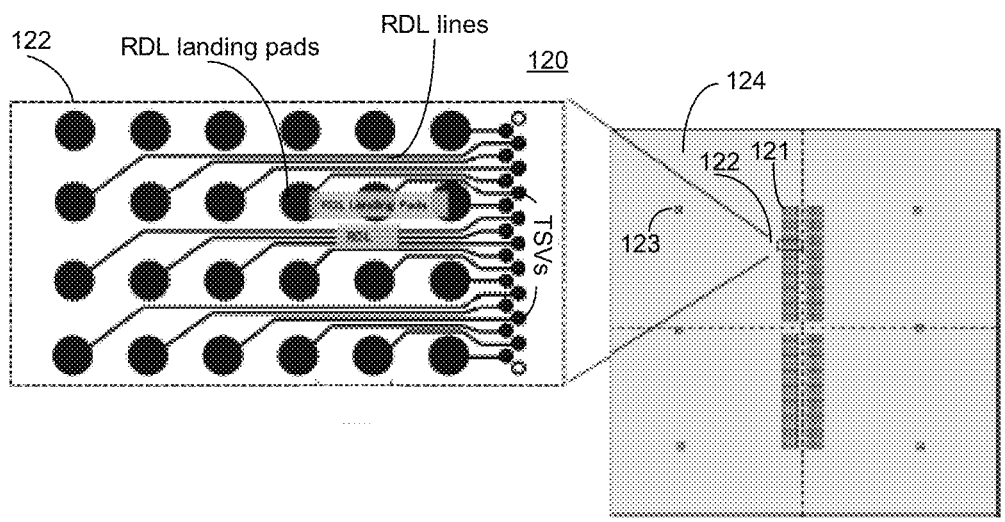
FIG. 1B illustrates a top view of a Redistribution Layer (RDL) layout on the backside of a die having Through-Silicon-Vias (TSVs).

FIG. 1B illustrates a top view 120 of a Redistribution Layer (RDL) layout on a backside 124 of a die having TSV arrays 121. A zoomed portion 122 of the TSV arrays 121 shows how the TSVs fan-out to standard RDL landing pad configuration via RDL lines for backside chip-to-chip connections. Except for a few TSVs sprinkled on the backside (as shown by TSVs 123), most space on backside 124 is empty.

In some embodiments, the currently unused backside surface of the thinned device wafer (e.g., the empty space on backside area 124) is used for integrating planar passive devices (e.g., distributive filter elements, inductors, baluns, etc.) into the existing backside RDL layer, thus saving space on the front-side or active side of the die. This saved area on the active side of the die can be made available for addition active circuitry and/or to make the overall die size smaller. For some embodiments, because the planar passive devices are fabricated within the existing backside RDL layer, no additional fabrication processing is needed for adding the backside passive planar devices to the backside of the thinned device die.

In some embodiments, one or more Surface Acoustic Wave (SAW) filters are integrated on the backside of the die which incorporates TSVs for the purpose of realizing electrical connections between the active receivers/transmitter circuits on the front-side of the die and the SAW filters on the backside of the die. In some embodiments, this monolithic Integrated Circuit (IC) is mounted flip-chip onto a traditional package substrate with active CMOS circuitry flipped downwards and the SAW filters pointing upwards. In some embodiments, the SAW filters of the flip-chip package are covered by a metallic lid to protect the device and to provide Electro-magnetic Interference (EMI) and Radio-Frequency Interference (RFI) shielding.

In some embodiments, the RDL processing is extended to form one or more SAW filters, where the RDL metal forms the Inter-digital Transducer (IDT) electrodes which are directly attached to the piezoelectric substrate layer (e.g., AlN layer) on top of it. In some embodiments, the fabrication of the piezoelectric layer is a process step implemented using a standard TSV process. One technical effect of some embodiments is that a large number of SAW filters for multiple frequency bands can be realized since the backside of the die, unlike the front-side of the die, is not occupied by other circuitry.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors used in various blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
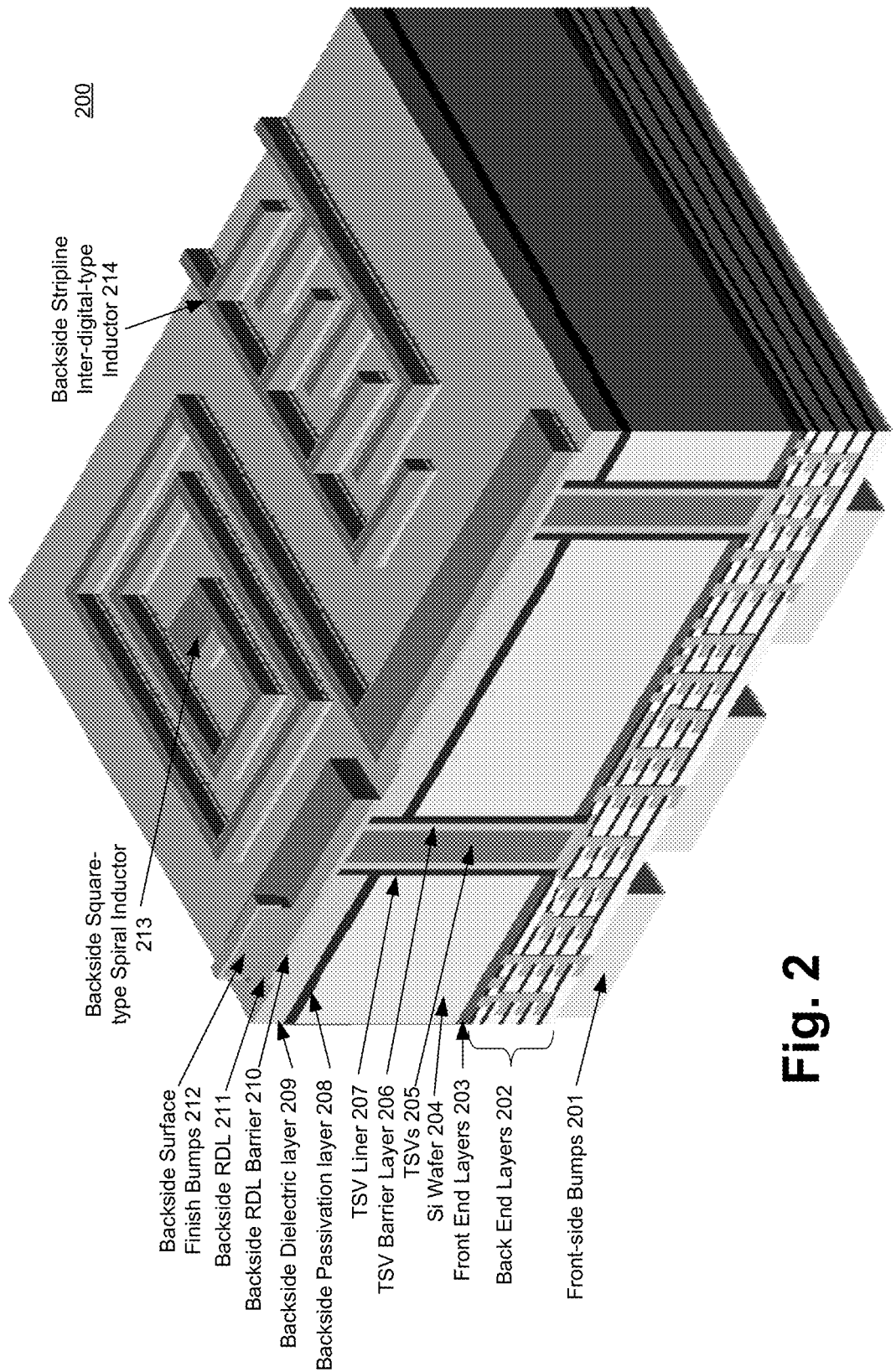
FIG. 2 illustrates a three dimensional (3D) view of a die with one or more planar passive devices disposed on the backside of the die, according to some embodiments of the disclosure.

FIG. 2 illustrates a three dimensional (3D) view 200 of a die with one or more planar passive devices disposed on the backside of the die, according to some embodiments of the disclosure. So as not to obscure the embodiments, every possible layer is not shown in the 3D view 200.

In some embodiments, the die comprises several layers including layers having Front-side Bumps 201, Back End Interconnect Layers 202, Front End Transistor Layers 203, Silicon (Si) Wafer layer 204, Backside Passivation layer 208 (e.g., SIN or SiC layer), Backside Dielectric layer 209 (e.g., SIN, $SiO_2$, or SiC layer), Backside RDL Barrier 210, Backside RDL 211, layer of Backside Surface Finish Bump 212, and Backside planar devices (e.g., 213 and 214). The Front-side Bumps 201 may couple to a package (e.g., flip-chip package). In some embodiments, the Backside Surface Finish Bumps 212 may couple to another die or to other nodes of a package.

In some embodiments, planar passive devices (e.g., devices 213 and 214) are formed using Backside RDL 211 in the free regions of RDL 124. In some embodiments, the front-side (i.e., Back End Layers 202 and Front End Layers 203) of the die includes an active region for active devices (e.g., transistors, amplifiers, etc.) while the backside of the die includes planar passive devices. In some embodiments, the backside passive planar devices (e.g., devices 213 and 214) are electrically coupled to the front-side active devices via TSVs 205. Here, TSVs 205 are conductive vias (e.g., Cu) formed in the substrate (i.e., Si Wafer 204) to couple the front-side active region to the backside of the die. In some embodiments, TSVs 205 are surrounded by TSV Liner 207.

In some embodiments, TSVs 205 are coupled to Backside Surface Finish Bumps 212 (e.g., TSVs in array portion 122). In some embodiments, TSVs 205 are coupled to the planar passive device (e.g., devices 213 and/or 214) in RDL lines.

While the embodiments of FIG. 2 show two passive planar devices—Backside Square-type Spiral Inductor 213 and a Backside Stripline Inter-digital-type Inductor 214—any number and type of planar passive devices may be formed on the backside of the die. For example, passive planar devices include planar band-pass filters (BPFs), planar low-pass filters (LPFs), simple planar filters, inductors, baluns, antennas, SAW filters, MEMs (micro-electrical-mechanical systems), etc.

Examples of planar BPFs include: capacitive gap stripline filter, stripline parallel coupled lines filter, stripline inter-digital filter (as shown in FIG. 2), stripline hairpin filter, stripline stub filter (e.g., having λ/4 short circuit stubs), fractal-shape microstrip filter, etc. Examples of planar LPFs include: stepped-impedance LPF formed from alternate high and low impedance sections of a line, stepped-impedance LPF with shunt resonators, standard stubs λ/4 apart on alternating sides of a main line, butterfly stubs, double stubs in parallel, radial stub, paralleled radial stubs, clover-leaf stub (i.e., triple paralleled radial stubs), etc. Examples of simple planar filters include: short-circuit stub in parallel with a main line, open-circuit stub in parallel with a main line, short-circuit line coupled to a main line, short-circuit lines, coupled open-circuit lines, an abrupt stepped impedance, a line coming to an abrupt end, a hot or slit in a line, a transverse half-slit across the line, a gap in the line, etc. Examples of antennas include: coplanar waveguide (CPW) antenna, microstrip antenna, stripline slot antenna, etc.

One non-limiting technical effect of some of the embodiments of FIG. 2 is that the large amount of currently unused space on the backside of the thinned TSV device wafer is now used for planar passive devices which are generally large in size compared to active devices. By placing the planar passive devices on the existing RDL, no additional fabrication processing may be needed. Since planar passive devices are generally large in size, as shown with reference to FIG. 1, by forming the passive planar devices on the backside of the die, space is freed up in the active region (or front-side) of the die. This freed up space can reduce the size of the die which may translate into cost savings.

Figure 3:
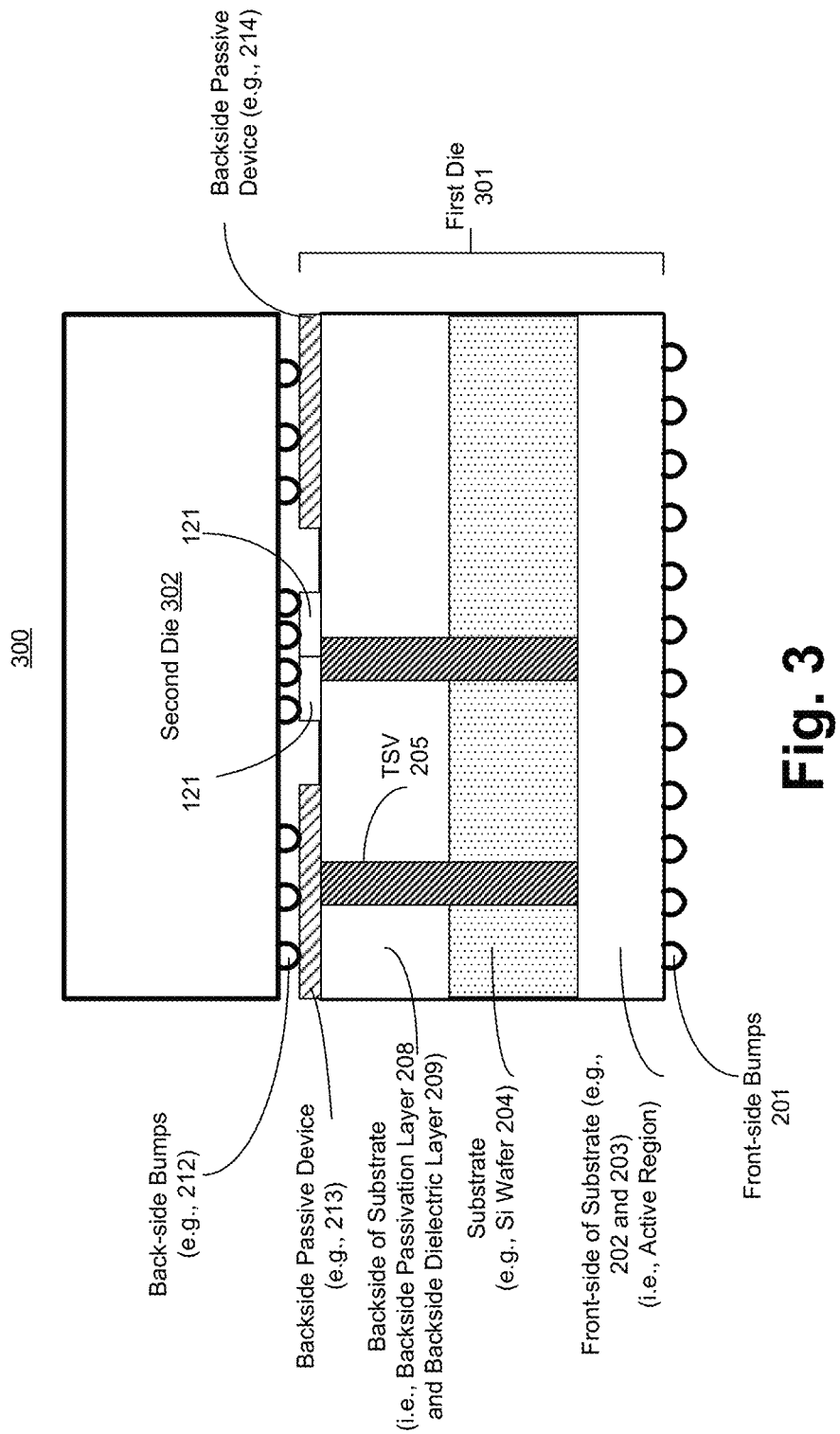
FIG. 3 illustrates a cross-section of a stacked die having one or more planar passive devices disposed on the backside of one of the dies, according to some embodiments of the disclosure.

FIG. 3 illustrates a cross-section 300 of a stacked die having one or more planar passive devices disposed on the backside of one of the dies, according to some embodiments of the disclosure. It is pointed out that those elements of FIG. 3 having the same reference numbers (or names) as the elements of any other figure can operate or function in any manner similar to that described, but are not limited to such.

While some embodiments of FIG. 3 are described with reference to two stacked dies—First Die 301 and Second Die 302), any number of dies can be stacked and TSVs can be used to electrically couple various nodes (e.g., in Front-side of Substrate and in Backside of Substrate of the multiple dies). In some embodiments, the backside of First Die 301 is coupled to the front-side of Second Die 302 via Back-side Bumps of First Die 301. In some embodiments, Backside Passive Device (e.g., device 213) is coupled to the active region of Front-side of Substrate of First Die 301. For example, active circuits (e.g., amplifiers) in First Die 301 are coupled to the Backside Square-type Spiral Inductor 213 of First Die 301. In some embodiments, Backside Passive Device (e.g., device 214) is coupled to the active region of the Front-side of Substrate of Second Die 302. For example, active circuits (e.g., amplifiers) in Second Die 302 are coupled to the Backside Stripline Inter-digital-type Inductor 214 of First Die 301.

Figure 4:
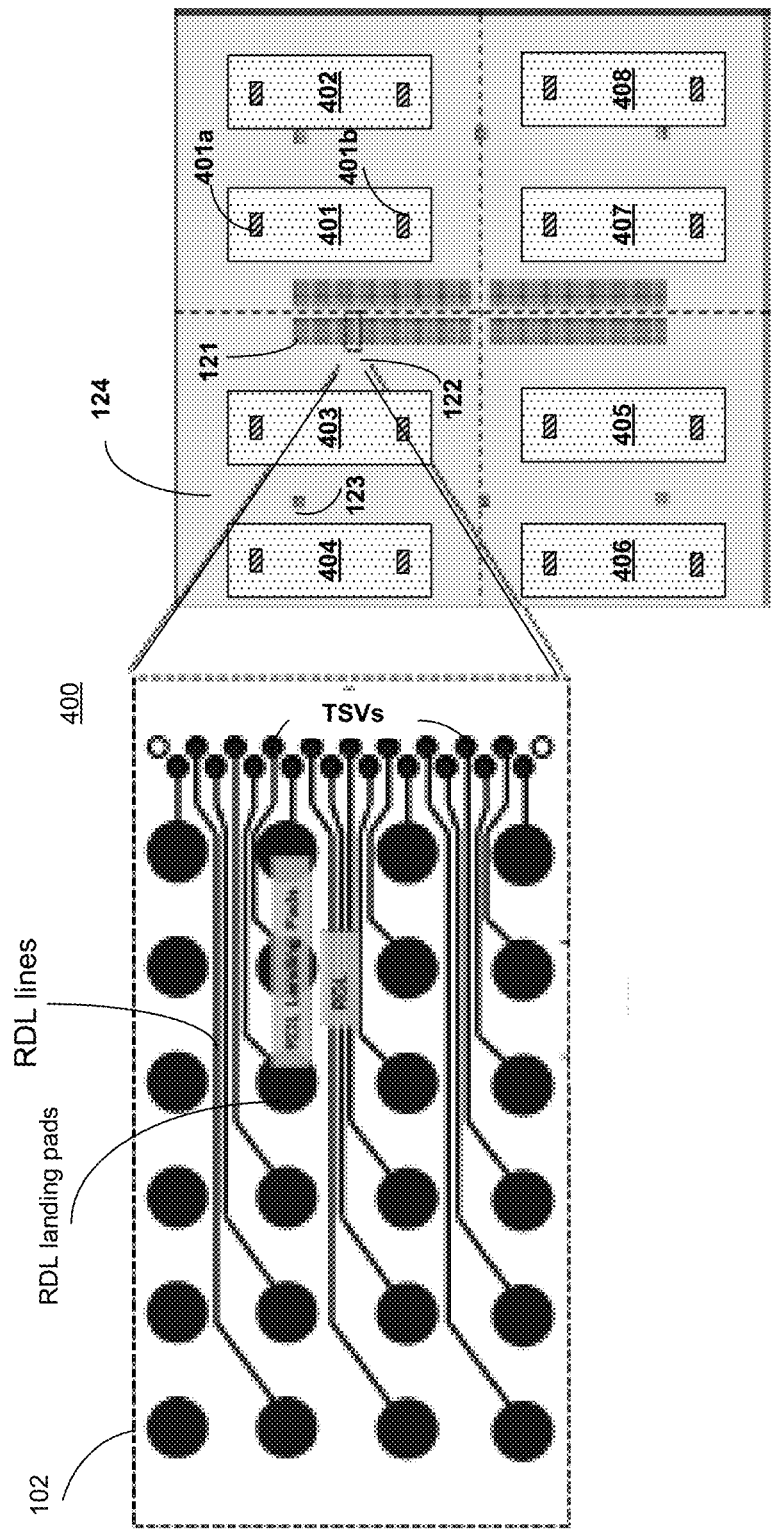
FIG. 4 illustrates a top view of an RDL layout on the backside of a die having TSVs and a plurality of planar passive devices disposed on the backside, according to some embodiments of the disclosure.

FIG. 4 illustrates a top view 400 of an RDL layout on the backside of a die having TSVs and a plurality of planar passive devices disposed on the backside, according to some embodiments of the disclosure. It is pointed out that those elements of FIG. 4 having the same reference numbers (or names) as the elements of any other figure can operate or function in any manner similar to that described, but are not limited to such.

In some embodiments, the large free space of backside 124 is used for forming passive planar devices 401 to 408. While the embodiments show eight passive planar devices, any number of planar devices may be formed (albeit, area permitting) in the free space of backside 124. In some embodiments, TSVs 401a and 401b (e.g., TSVs 205) are used to couple the passive planar device (e.g., device 401) to the active region of the front-side of the same die or another die.

Figure 5A:
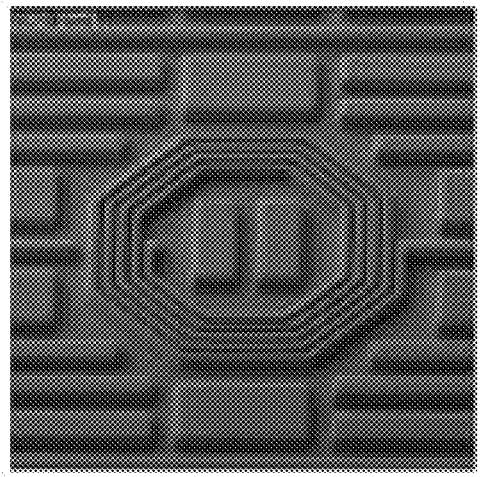
FIGS. 5A-D illustrate pictures of various inductors formed on the backside of the die, according to some embodiments of the disclosure.
Figure 5B:
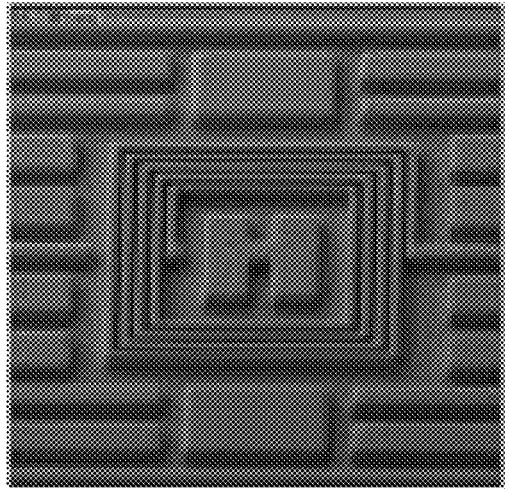
Figure 5C:
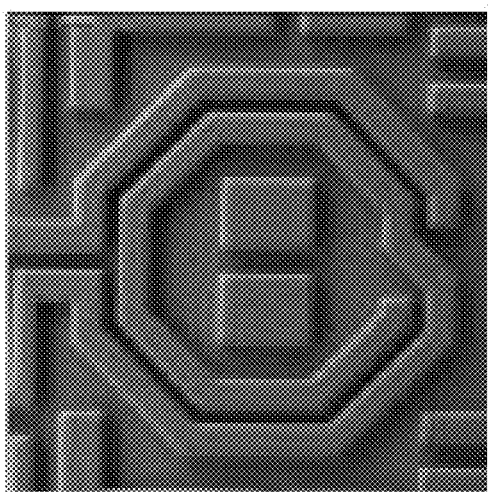
Figure 5D:
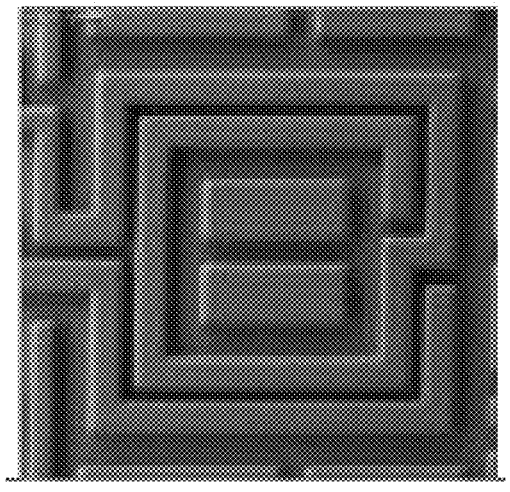

FIGS. 5A-D illustrate pictures 500, 520, 530, and 540 of various inductors and baluns formed on backside 124 of the die, according to some embodiments of the disclosure. FIG. 5A illustrates a picture 500 of an octagon spiral-type inductor. FIG. 5B illustrates a picture 520 of a square spiral-type inductor. FIG. 5C illustrates a picture 530 of an octagon-type balun. FIG. 5D illustrates a picture 540 of a square-type balun. In some embodiments, the inductors and baluns may replace the inductors 213 and 214.

FIG. 6 illustrates a cross-section 600 of a die having RDL fingers on the backside of the die for IDTs and for reflector shorted metal strip arrays, according to some embodiments of the disclosure. It is pointed out that those elements of FIG. 6 having the same reference numbers (or names) as the elements of any other figure can operate or function in any manner similar to that described, but are not limited to such.

Cross-section 600 shows the front-side of the die having Active Circuitry (e.g., transistors, amplifiers, etc.), backside of the die having one or more SAW filters with Input and Output IDTs, Bragg Reflectors, and Signal and Ground (GND) TSVs for electrically coupling the Active Circuitry (e.g., active receivers/transmitter circuits) through the substrate (i.e., Die Si) to the passive planar devices (e.g., SAW filters) on the RDL of the backside (e.g., formed with $SiO_2$). The Bragg Reflectors are used to prohibit the acoustic waves from escaping into the substrate. In some embodiments, the Signal TSVs are coupled to Metal routes in the front-side of the die. In some embodiments, the GND TSVs are coupled to ground pads in the front-side of die. In some embodiments, this monolithic SoC is mounted flip-chip onto traditional package substrate with active CMOS circuitry (i.e., Active Circuitry) flipped downwards and SAW filters pointing upwards. Since the backside of the SoC is not occupied by other active circuitry (e.g., transistors, amplifiers, transmitters, receivers, etc.) a large number of SAW filters for multiple frequency bands and other planar passive devices can be realized on the backside.

FIG. 7 illustrates a cross-section 700 of a die with reference to FIG. 6, with piezoelectric layer and the die is bonded into a flip-chip package, according to some embodiments of the disclosure. It is pointed out that those elements of FIG. 7 having the same reference numbers (or names) as the elements of any other figure can operate or function in any manner similar to that described, but are not limited to such.

In some embodiments, the SAW filter is fabricated on the backside of the die by means of a TSV last process, where the die is glued with the active side (i.e., front-side) facing downwards onto an interposer. In some embodiments, the TSV process starts after the standard CMOS fabrication steps are entirely finished. In some embodiments, the RDL processing is extended to form one or more SAW filters, where the RDL metal forms IDT electrodes which are directly attached to the Piezoelectric substrate layer (e.g., AlN layer) on top of it. The fabrication of the Piezoelectric layer may be a special process step using a standard TSV process, according to some embodiments. The piezoelectric layer converts the mechanical energy into electrical energy and vice-versa with low energy loss. In some embodiments, a Passivation Layer is formed above the Piezoelectric Layer. In some embodiments, ground and signal pads are coupled to the Front-side Bumps which are then coupled to the Flip-Chip Substrate. In some embodiments, the Mold Cap provides protection to the die (including the planar passive devices on the backside) and the Flip-Chip Substrate.

Figure 8:
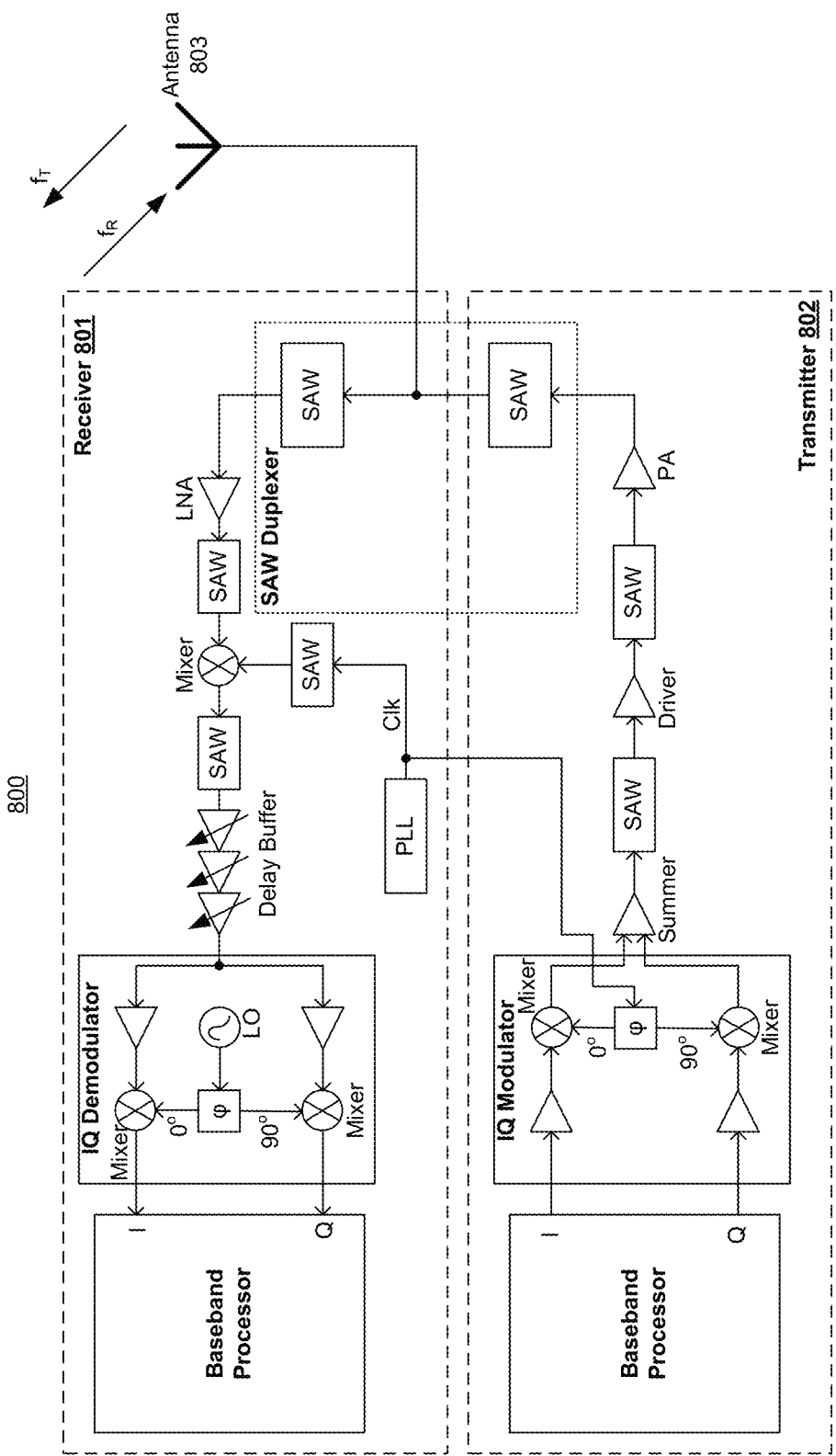
FIG. 8 illustrates a mobile phone RF circuit architecture with a plurality of Surface Acoustic Wave (SAW) filters formed on the backside of a die, according to some embodiments of the disclosure.

FIG. 8 illustrates a mobile phone RF circuit architecture 800 with a plurality of SAW filters formed on the backside of a die, according to some embodiments of the disclosure. It is pointed out that those elements of FIG. 8 having the same reference numbers (or names) as the elements of any other figure can operate or function in any manner similar to that described, but are not limited to such.

In some embodiments, architecture 800 comprises Receiver 801, Transmitter 802, and Antenna 803 such that the passive devices are formed using RDL lines on the backside of the die. Receiver 801 comprises a SAW Duplexer, Low Noise Amplifier (LNA), SAW filters, Mixer, Delay Buffers, IQ Demodulator, and Baseband Processor. So as not to obscure the embodiments, all components of Receiver 801 are not shown.

SAW Duplexer receives incoming signal on frequency band $f_R$ via Antenna 803 and filters it using a SAW filter. The filtered output of the SAW Duplexer is then provided to the LNA for amplification. Output of the LNA is then filtered using another SAW filter and its output is mixed by a Mixer with a filtered clock (Clk). The filtered Clk is filtered using a SAW filter. The clock may be generated by a PLL. The output of the Mixer is then filtered using a SAW filter. The output of the SAW filter is then delayed by a programmable Delay Buffer having programmable or variable delay. The output of the Delay buffer is then demodulated using IQ Demodulator. The IQ Demodulator includes two Mixers and a Local Oscillator (LO) that is used to provide 'I' and 'Q' clocks which are 90° apart in phases (i.e., 0° and 90° phases). The demodulated output is then processed by the Baseband Processor.

Transmitter 802 comprises a SAW Duplexer (which may be shared with Receiver 801), Power Amplifier (PA), SAW filters, Driver, Summer, IQ Modulator, and Baseband Processor. So as not to obscure the embodiments, all components of Transmitter 802 are not shown. Baseband Processor generates 'I' and 'Q' data which is modulated by the IQ Modulator. The IQ modulator includes Mixers which mix the 'I' data with a clock having 0° phase relative to another clock having 90° phase, which is used for mixing with the 'Q' data. The output of the IQ Modulator is then summed by a Summer. Output of the Summer is filtered by a SAW filter. The output of the SAW filter is buffered by a Driver and filtered again by another SAW filter. The output of that SAW filter is amplified by a PA before being transmitted by Antenna 803.

In some embodiments, the SAW filters in Receiver 801 and Transmitter 802, and Antenna 803 are formed using RDL lines on the backside of the die while the remaining components (e.g., Baseband Processors, IQ Demodulator, IQ Modulator, Delay Buffer, Mixer, LNA, Summer, Driver, PA, etc.) of Receiver 801 and Transmitter 802 are formed on the front-side of the die (i.e., the active region of the die). SAW filters and Antenna 803 take up a large area of architecture 800 compared to other active devices. Forming these planar passive devices (i.e., SAW filters and Antenna 803) saves a lot of space from the active area (i.e., from the front-side of the die) and may result in overall smaller processor die size, according to some embodiments. A smaller processor die size having architecture 800 can further reduce the form factor of a mobile device. In some embodiments, the Baseband Processors of Receiver 801 and Transmitter 802 are formed on a different die(s) (e.g., Second Die 302) in a stacked die configuration as described with reference to FIG. 2.

Figure 9A:
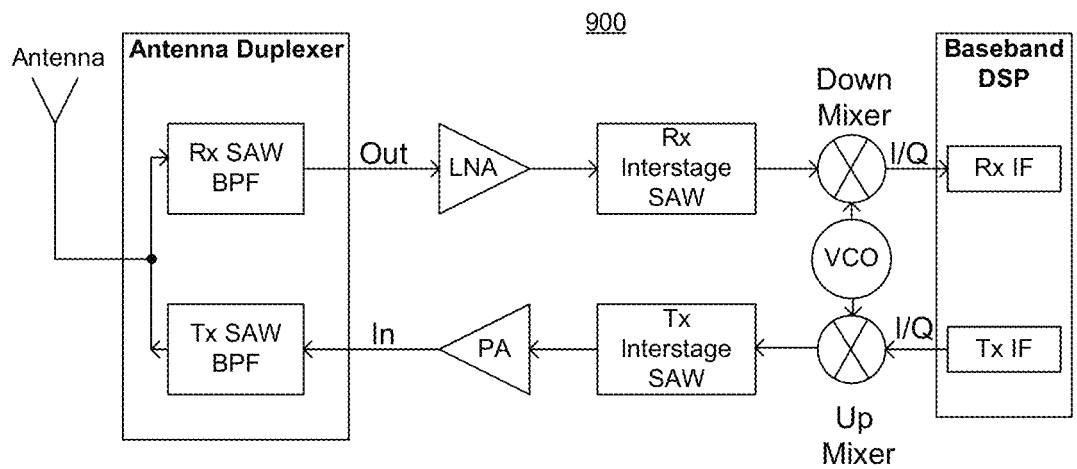
FIG. 9A illustrates an RF front-end circuit architecture with a plurality of SAW filters and an antenna formed on the backside of a die, according to some embodiments of the disclosure.

FIG. 9A illustrates an RF front-end circuit architecture 900 with a plurality of SAW filters and antenna formed on the backside of a die, according to some embodiments of the disclosure. It is pointed out that those elements of FIG. 9A having the same reference numbers (or names) as the elements of any other figure can operate or function in any manner similar to that described, but are not limited to such. So as not to obscure the embodiments, all components of the RF front-end circuit architecture 900 are not shown.

Architecture 900 comprises active devices such as LNA, PA, Up Mixer, Down Mixer, Voltage Controlled Oscillator (VCO), and Baseband Digital Signal Processor (DSP), and passive devices such as SAW BPF for receiver (Rx) and transmitter (Tx) in the Antenna Duplexer, Rx and Tx Interstage SAW filters, and Antenna coupled together as shown. In some embodiments, the Interstage SAW filters are realized as SAW transversal filter using apodization weighted finger overlap in the receiving IDT. In some embodiments, the Antenna Duplexer is formed by two multi IDT SAW filters which provide lower insertion losses and better stop band rejection compared to traditional Antenna Duplexer. Apodization is a method used for weighting a transducer. The apodized structure is the bell shaped finger in the RX interstage SAW filter of FIG. 9B. Referring back to FIG. 9A, in comparison to ladder type SAW filters, the multi IDT SAW filters use one acoustic row and therefore provide an integration friendly solution using less area.

In some embodiments, the Piezoelectric layer is deposited on top of the passive devices. In some embodiments, the passive devices (i.e., the SAW filters and the Antenna) are formed on the backside of the die while active devices (i.e., the LNA, PA, VCO, Down Mixer, Up Mixer and the Baseband DSP) are formed on the front-side of the die. In some embodiments, TSVs are used to transmit the signal from the active side of the die (i.e., the front side) to the backside of the die.

Figure 9B:
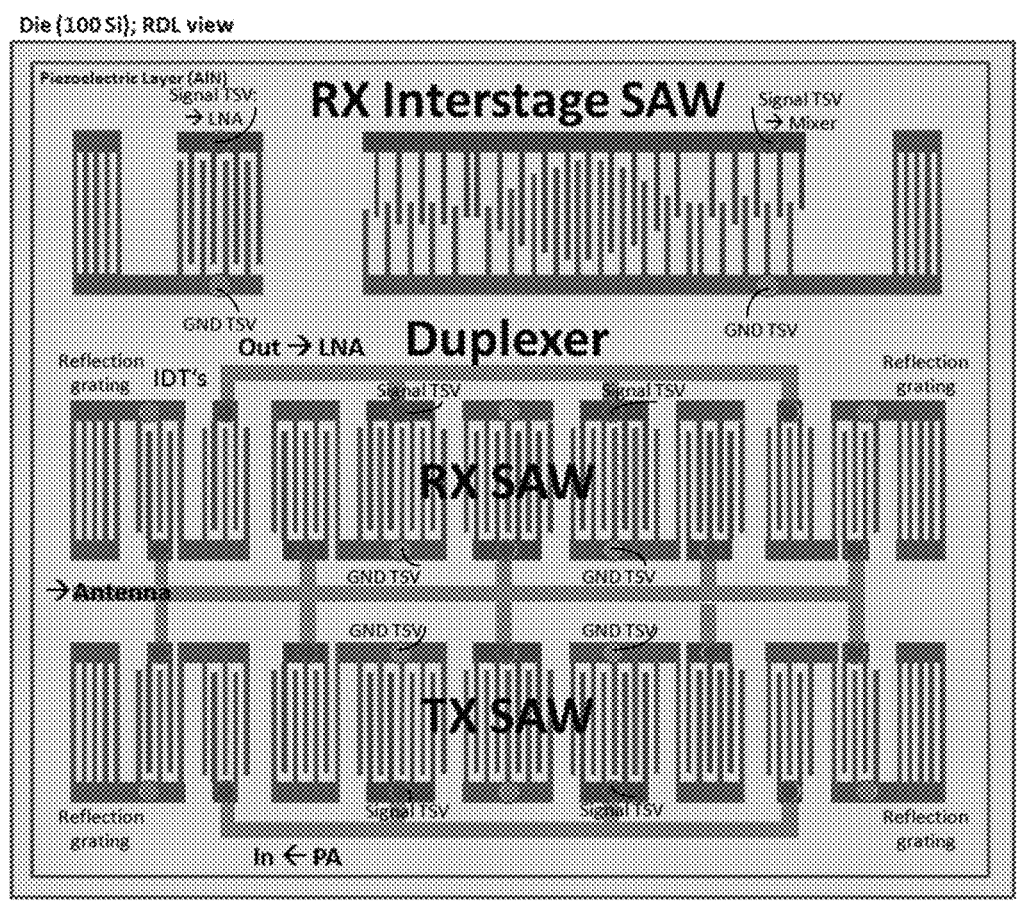
FIG. 9B illustrates a top view of an RDL layer on the backside of a die having the SAW filters and the antenna of FIG. 9A, according to some embodiments of the disclosure.

FIG. 9B illustrates a top view 920 of an RDL layer on the backside of a die having the SAW filters and antenna of FIG. 9A, according to some embodiments of the disclosure. It is pointed out that those elements of FIG. 9B having the same reference numbers (or names) as the elements of any other figure can operate or function in any manner similar to that described, but are not limited to such. So as not to obscure the embodiments, not all the IDT topologies are shown. Other topologies of IDT may be used too.

Figure 10:
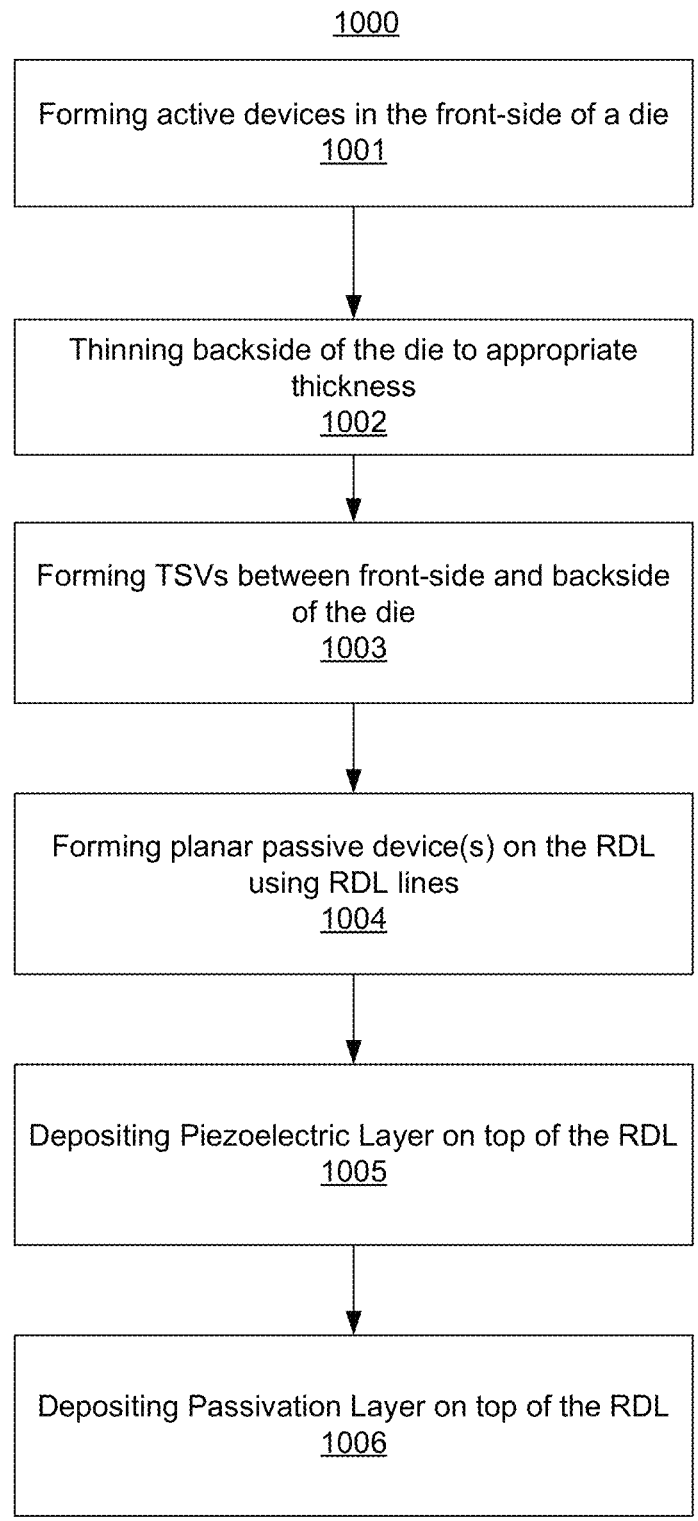
FIG. 10 illustrates a flowchart of a method of forming a planar passive device (e.g., SAW filter) on the backside of a die, according to some embodiments of the disclosure.

FIG. 10 illustrates a flowchart 1000 of a method of forming a planar passive device (e.g., SAW filter) on the backside of a die, according to some embodiments of the disclosure. It is pointed out that those elements of FIG. 10 having the same reference numbers (or names) as the elements of any other figure can operate or function in any manner similar to that described, but are not limited to such.

Although the blocks in the flowchart with reference to FIG. 10 are shown in a particular order, the order of the actions can be modified. Thus, the illustrated embodiments can be performed in a different order, and some actions/ blocks may be performed in parallel. Some of the blocks and/or operations listed in FIG. 10 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1001, active devices are formed in the front-side of the die using standard CMOS process. At block 1002, the backside of the die is thinned to appropriate thickness. At block 1003, TSVs are formed between the front-side and the backside of the die. At block 1004, SAW filters (or any other planar passive devices) are formed in the RDL using RDL lines. At block 1005, a Piezoelectric Layer is deposited on top of the RDL. At block 1006, a Passivation Layer is deposited on top of the Piezoelectric Layer.

Figure 11:
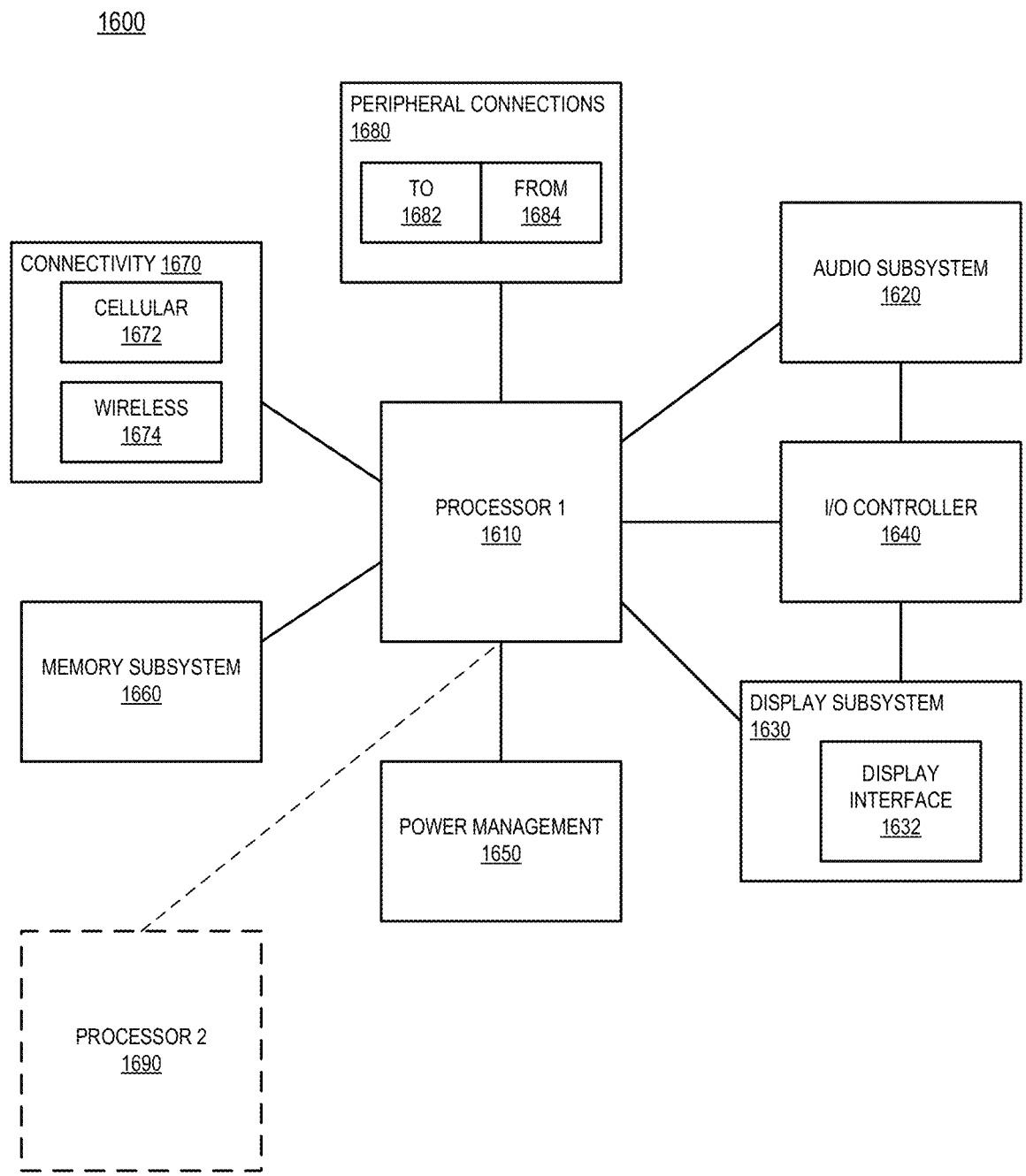
FIG. 11 illustrates a smart device or a computer system or a SoC (System-on-Chip) having passive planar devices formed on the backside of one or more dies of the SoC, which is formed from stacked dies or from non-stacked dies, according to some embodiments of the disclosure.

FIG. 11 illustrates a smart device or a computer system or a SoC having passive planar devices formed on the backside of one or more dies of the SoC formed from stacked dies or from non-stacked dies, according to one embodiment of the disclosure. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 having passive planar devices formed on the backside of the first processor, according to the embodiments discussed. Other blocks of the computing device 1600 may also include the apparatus having passive planar devices formed on the backside of other blocks of the embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a backside of a first die having a RDL; and one or more passive planar devices disposed on the backside, the one or more passive planar devices formed in the RDL. In some embodiments, the apparatus comprises: a front-side of the first die having an active region; and one or more vias to couple the active region with the one or more passive planar devices. In some embodiments, the one or more vias include ground and signal vias. In some embodiments, the apparatus comprises a second die coupled to the backside of the first die. In some embodiments, the second die includes an active region coupled to the one or more passive planar devices of the first die.

In some embodiments, the apparatus comprises: a piezoelectric layer formed on the backside of the first die such that the piezoelectric layer is disposed on the RDL. In some embodiments, the apparatus comprises a passivation layer disposed on the piezoelectric layer. In some embodiments, the one or more passive planar devices is one or more of: a SAW filter; a band-pass filter; a low-pass filter; a high-pass filter; an inductor; an antenna; or a balun. In some embodiments, the apparatus comprises bumps formed on the backside of the die to couple the one or more passive planar devices to another die.

In another example, a system is provided a memory; a processor die coupled to the memory, the processor die an apparatus according to the apparatus described above; and a wireless interface for allowing the processor to communicatively couple with another device. In some embodiments, the system comprises a display interface for displaying content processed by the processor.

In another example, an apparatus comprises: a backside of a die having a RDL; one or more SAW filters disposed on the backside, the one or more SAW filters formed in the RDL; and a piezoelectric layer disposed on the RDL over the one or more SAW filters. In some embodiments, the apparatus comprises: a front-side of the die having an active region; and one or more vias to couple the active region with the one or more SAW filters.

In some embodiments, the active region comprises a LNA coupled to one of the one or more SAW filters. In some embodiments, the active region comprises a PA coupled to one of the one or more SAW filters. In some embodiments, the apparatus further comprises one or more passive planar devices disposed on the backside.

In another example, a system is provided a memory; a processor die coupled to the memory, the processor die an apparatus according to the apparatus described above; and a wireless interface for allowing the processor to communicatively couple with another device. In some embodiments, the system comprises a display interface for displaying content processed by the processor.

In another example, a method is provided which comprises: forming vias between front-side and backside of a die; and forming a planar passive device on the backside having a RDL. In some embodiments, the method comprises depositing piezoelectric layer on top of the RDL. In some embodiments, the method comprises: depositing passivation layer on top of the RDL. In some embodiments, the vias are TSVs.

In some embodiments, the method comprises, prior to forming the planar passive device, thinning backside of the die. In some embodiments, the method comprises forming active devices on the front-side of the die. In some embodiments, the planar passive device is one of: a SAW filter; a band-pass filter; a low-pass filter; a high-pass filter; an inductor; an antenna; or a balun. In some embodiments, the method comprises: forming bumps on the backside of the die to couple the passive planar device to another die.

In another example, an apparatus is provided which comprises: means for forming vias between front-side and backside of a die; and means for forming a planar passive device on the backside having a RDL. In some embodiments, the apparatus comprises means for depositing piezoelectric layer on top of the RDL. In some embodiments, the apparatus comprises means for depositing passivation layer on top of the RDL. In some embodiments, the vias are TSVs. In some embodiments, the apparatus comprises means for thinning backside of the die. In some embodiments, the apparatus comprises means for forming active devices on the front-side of the die. In some embodiments, the planar passive device is one of: a SAW filter; a band-pass filter; a low-pass filter; a high-pass filter; an inductor; an antenna; or a balun.

In another example, a system is provided a memory; a processor die coupled to the memory, the processor die an apparatus according to the apparatus described above; and a wireless interface for allowing the processor to communicatively couple with another device. In some embodiments, the system comprises a display interface for displaying content processed by the processor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a die having a back-side and a front-side, wherein the back-side of the die includes one or more passive devices in or on a redistribution layer (RDL), wherein the front-side of the die includes one or more active devices, and wherein the one or more passive devices are positioned in one or more regions in or on the RDL;
   bumps directly coupled to the one or more passive devices;
   a first layer including piezoelectric material, wherein the layer is adjacent to the one or more passive devices; and
   a second layer including passivation material, wherein the second layer is adjacent to the first layer.

2. The apparatus of claim 1, wherein the die is a first die, and wherein the apparatus comprises a second die coupled to the first die.

3. The apparatus of claim 2, wherein the second die is coupled to the first die via the back-side of the first die.

4. The apparatus of claim 1, wherein the one or more passive planar devices is one or more of: a SAW filter; a capacitive gap stripline band-pass filter; a stripline interdigital filter; a stripline hairpin filter; a stripline stub filter fractal-shape microstrip filter; a stepped-impedance filter; a stepped-impedance filter with a shunt resonator; a butterfly stub; double stubs, a radial stub, paralleled radial stubs, a clover-leaf stub; a short-circuit stud; an open-circuit stub; a coplanar waveguide; a microstrip antenna; or stripline slot antenna.

5. The apparatus of claim 1, wherein the one or more active devices include a low noise amplifier.

6. The apparatus of claim 1, further comprising one or more vias to couple the one or more active devices with the one or more passive devices.

7. An apparatus comprising:
   a die having a back-side and a front-side, wherein the back-side of the die includes:
     a receiver SAW filter in or on a redistribution layer (RDL);
     a transmitter SAW filter in or on the RDL; and
     an antenna in or on the RDL,
   and wherein the front-side of the die includes:
     a low noise amplifier (LNA) coupled to the receiver SAW filter; and
     a power amplifier (PA) coupled to the transmitter SAW filter; and
   one or more vias coupled to the back-side and the front-side of the die.

8. The apparatus of claim 7, wherein the back-side of the die includes a Bragg Reflector.

9. The apparatus of claim 8, further comprising a layer including piezoelectric material, wherein the layer is adjacent to the SAW filter.

10. The apparatus of claim 9, wherein the layer is a first layer, wherein the apparatus further comprises a second layer including passivation material, and wherein the second layer is adjacent to the first layer.

11. The apparatus of claim 7, wherein the back-side of the die includes:

a receiver interstage SAW filter coupled to an output of the LNA; and a transmitter interstage SAW filter coupled in an input of the PA.

12. The apparatus of claim 11, wherein the front-side of the die includes:

a first mixer coupled to the receiver interstage SAW filter;

a second mixer coupled to the transmitter interstage SAW filter; and a voltage controlled oscillator (VCO) coupled to the first mixer and the second mixer.

13. The apparatus of claim 7, wherein the die is a first die, and wherein the apparatus comprises a second die coupled to the first die.

14. The apparatus of claim 13, wherein the second die is coupled to the first die via the back-side of the first die.

15. The apparatus of claim 13, wherein the second die comprises a baseband digital signal processor.

16. A system comprising:

a memory;

a processor coupled to the memory, wherein the processor includes:

a die having a back-side and a front-side, wherein the back-side of the die includes one or more passive devices in or on a redistribution layer (RDL), wherein the front-side of the die includes one or more active devices, and wherein the one or more passive devices are positioned in one or more regions in or on the RDL; and bumps coupled to the one of more passive devices; and a display communicatively coupled to the processor;

a first layer including piezoelectric material, wherein the layer is adjacent to the one or more passive devices; and a second layer including passivation material, wherein the second layer is adjacent to the first layer.

17. The system of claim 16, wherein the die is a first die, and wherein the apparatus comprises a second die coupled to the first die.

18. The system of claim 17, wherein the second die is coupled to the first die via the back-side of the first die.

* * * * *